April 23, 1957 A. VAN WEEL 2,790,078

FREQUENCY-STABILIZED OSCILLATOR

Filed Feb. 18, 1953

INVENTOR

ADELBERT VAN WEEL

BY [signature]

AGENT

United States Patent Office 2,790,078

Patented Apr. 23, 1957

2,790,078

FREQUENCY-STABILIZED OSCILLATOR

Adelbert Van Weel, Eindhoven, Netherlands, assignor, by mesne assignments, to North American Philips Company, Inc., New York, N. Y., a corporation of Delaware Application February 18, 1953, Serial No. 337,608

Claims priority, application Netherlands March 1, 1952

6 Claims. (Cl. 250—36)

Figures 1, 2, 3, 4:
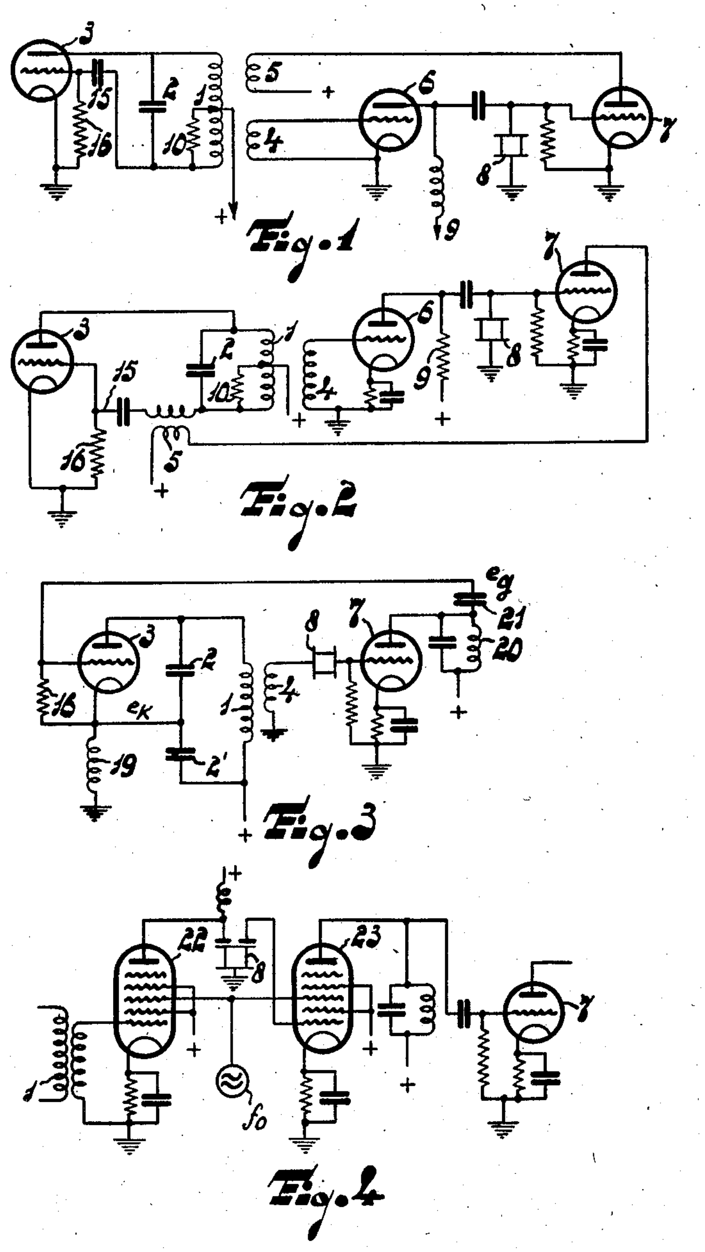

This invention relates to frequency-stabilized oscillators, for example for diathermy purposes, comprising an oscillator tube associated with a first feedback path involving self-oscillation of the oscillator and with a second feedback path including an auxiliary amplifier tube and a highly selective element, for example a crystal, for stabilisation of the produced oscillation.

In a known circuit-arrangement for frequency-stabilized oscillators, the oscillator wave is supplied, by way of the oscillatory circuit provided in the anode circuit of the oscillator tube, to a first amplifier tube. It then passes through a crystal and is subsequently returned inductively as a stabilizing oscillation through a second amplifier tube to said oscillatory circuit. The stabilisation energy to be supplied by the said second amplifier tube to the oscillatory circuit, if the natural frequencies of the oscillatory circuit and of the crystal are different from each other, is of the same order as that of the oscillator tube itself.

The invention has more particularly for its object a power oscillator such as used, for example, in diathermy apparatus and achieves a reduction in the amount of the required stabilisation energy.

In accordance with the invention, the output voltages of both feedback paths are supplied in series-connection to the grid-cathode impedance of the oscillator tube, said grid-cathode impedance highly exceeding the load impedance of the oscillatory circuit viewed from the grid and cathode of the oscillator tube.

In order that the invention may be readily carried into effect, it will now be described in detail, with reference to the accompanying drawing, given by way of example, in which Fig. 1 shows a conventional circuit-arrangement, and Figs. 2 and 3 show embodiments of the invention.

Fig. 4 shows a variant of the circuit-arrangements depicted in Fig. 2 or 3.

The oscillator shown in Fig. 1 comprises an oscillator tube 3 associated with a first feedback path consisting of an anode circuit 1, 2 in Hartley-arrangement, thus causing self-oscillation of the oscillator. In order that the frequency of the oscillator thus formed may be stabilized, part of the anode voltage is supplied through an anode coupling coil 4 to an amplifier tube 6 having a reactive output impedance 9 and producing, through a crystal 8 and a second amplifier tube 7, a current which is inductively returned through the coupling coil 5 to the oscillatory circuit 1, 2.

In this known circuit-arrangement, the load impedance 10 often has a high value, whereas in contradistinction thereto, since the oscillator amplitude is usually limited by grid-current damping, the grid-cathode impedance 16 then has a comparatively low value, so that both impedances are within the same order. Said grid-cathode impedance is defined as the impedance between grid and cathode of the oscillator tube, if the grid lead 15 is interrupted whilst maintaining the voltages, whereas the load impedance 10, viewed from the grid and cathode of the oscillator tube (and therefore transformed as an impedance in parallel with the lower part of the circuit self-inductance 1) is defined as the impedance measured between the grid lead 15 and the cathode of tube 3 if the connection between lead 15 and the grid of tube 3 is broken whilst maintaining the voltages.

The example shown in Fig. 2 differs from the known circuit-arrangement shown in Fig. 1 only in that the load impedance 10 is much lower than the grid-cathode impedance 16 and in that the feedback voltage is not returned through coil 5 by inductive coupling with the oscillatory circuit 1, 2 but in series with the voltage across circuit 1, 2 to the grid of the oscillator tube 3, the reactance 9 being replaced by a resistor. It is found that in this case the tube 7 has to supply much less stabilisation energy than in the circuit-arrangement shown in Fig. 1.

This may be explained by considering the product of current and voltage supplied in both cases by tube 7, it being assumed that both circuit-arrangements comprise identical circuit-elements and the same degree of detuning occurs between the resonance frequency of circuit 1, 2 and that of the crystal 8. In the case of Figure 1 said product is $$\frac{R_{10}+R_{16}}{R_{10}}$$

times the product in the case of Fig. 2, where $R_{10}$ and $R_{16}$ represent the values of the impedances 10 and 16 respectively. In practice, for example $R_{16}=100R_{10}$ so that the step taken in accordance with the invention enables the tube 7 to be proportioned for power which is 100 times as low.

Fig. 3 shows a variant of the circuit-arrangement depicted in Fig. 2, the oscillator tube 3 having a first feedback path in the form of a Culpitts back-coupling 1—2—2′ and a second feedback path 8—7, whose two output voltages $e_k$ and $e_g$ respectively are supplied in series with each other to the grid-cathode impedance 16. The cathode impedance 19 of tube 3 then acts as a high-frequency tube, the anode circuit 20 of tube 7 serving for adjustment of the correct phase of the voltage of the second feedback path 8—7. A capacitor 21 serves to block the D.-C. voltage in the second feedback path, and also serves to couple the grid of tube 3 to the bottom end of the capacitor 2′, via the B+ terminal, in the first feedback path so that the grid and cathode of the tube 3 are effectively coupled together by the capacitor 2′.

If desired, the crystal frequency may be given a value different from that of the resonance frequency of the oscillatory circuit 1—2 and 1—2—2′ respectively by modifying the second feedback path 4—7 in accordance with Fig. 4. In this instance, the oscillator wave is first frequency-changed in a known manner by mixing it with an auxiliary frequency $f_0$ in a heterodyne stage 22 the resulting oscillation being passed through the crystal 8 and subsequently being demixed in a heterodyne stage 23 with the same auxiliary oscillation $f_0$, thus again supplying to tube 7 an oscillation of oscillator-frequency for frequency-stabilisation of the oscillator wave.

What is claimed is:

1. A frequency-stabilised oscillator comprising an oscillation generator including an electron discharge tube having at least a cathode and a grid, an impedance connected between said grid and said cathode, and a first feedback circuit coupled to said tube to feedback a voltage to said grid-cathode impedance to sustain self-oscillation in said generator said feedback circuit having a load impedance, the value of said grid-cathode impedance materially exceeding the value of said load impedance as viewed from the grid and cathode of said tube; and a second feedback circuit including an amplifier device coupled to the output of said generator and a highly selective element coupled to said amplifier device, said element being adapted for the stabilisation of the generator-produced oscillation, and means to apply the output voltage of the second feedback circuit in series with said first feedback voltage to said grid-cathode impedance.

2. An oscillator, as set forth in claim 1, wherein said highly selective element is a crystal.

3. An oscillator, as set forth in claim 1, wherein said second feedback circuit includes a first heterodyne stage, a second heterodyne stage, means for providing an auxiliary oscillation, and a highly selective element, said oscillator-produced frequency being mixed with said auxiliary oscillation in said first heterodyne stage, said mixed frequency being passed through said highly selective element for stabilisation of said mixed frequency, and said stabilised frequency being demodulated in said second heterodyne stage with said auxiliary oscillation.

4. An oscillator, as set forth in claim 3, wherein said highly selective element is a crystal.

5. A frequency-stabilised oscillator comprising an oscillation generator including an electron discharge tube having at least a cathode, a grid, and an anode, an impedance connected between said grid and said cathode, and a first feedback circuit having a load impedance and coupled to said tube to feedback a voltage to said grid-cathode impedance for sustaining oscillations in said generator, said grid-cathode impedance materially exceeding said load impedance as viewed from the grid and cathode of said tube; and a second feedback circuit including a first amplifier device having an input circuit and an output circuit, means for coupling said input circuit to the anode of said tube, a second amplifier device having an input circuit and an output circuit, means for connecting the output of said first device to the input circuit of said second device, a crystal connected across the input circuit of said second device, said crystal being adapted to provide stabilisation of the produced frequency, and means for coupling the output circuit of said second device to the grid of said tube, the output voltages of said feedback circuits being supplied in series to said grid-cathode impedance.

6. A frequency-stabilised oscillator comprising an oscillation generator including an electron discharge tube having at least a cathode, a grid, and an anode, an impedance connected between said grid and said cathode, and a first feedback circuit having a load impedance and coupling said anode to said grid-cathode impedance to produce self-oscillation of said generator, said grid-cathode impedance materially exceeding said load impedance as viewed from the grid and cathode of said tube; and a second feedback circuit including an amplifier device having at least a cathode, a grid and an anode, means for coupling the grid of said amplifier device to the anode of said tube, a crystal adapted for the stabilisation of the produced oscillation, said crystal being serially disposed in said coupling means, an output circuit connected to the anode of said amplifier device, and means for coupling said output circuit to the grid of said tube, the output voltages of said feedback circuits being supplied in series to said grid-cathode impedance.

References Cited in the file of this patent

UNITED STATES PATENTS

| | | |
|---|---|---|
| 2,076,264 | Chireix | Apr. 6, 1937 |
| 2,459,842 | Royden | Jan. 25, 1949 |